(12) United States Patent
Lin et al.

(10) Patent No.: US 12,402,285 B2
(45) Date of Patent: Aug. 26, 2025

(54) COOLING SYSTEM

(71) Applicant: Giga Computing Technology Co., Ltd., New Taipei (TW)

(72) Inventors: Jian-Hung Lin, New Taipei (TW); Ching-Chuan Huang, New Taipei (TW); Nobuhiro Adachi, New Taipei (TW)

(73) Assignee: Giga Computing Technology Co., Ltd., New Taipei (TW)

( * ) Notice: Subject to any disclaimer, the term of this patent is extended or adjusted under 35 U.S.C. 154(b) by 266 days.

(21) Appl. No.: 18/177,135

(22) Filed: Mar. 2, 2023

(65) Prior Publication Data

US 2024/0215207 A1 Jun. 27, 2024

(30) Foreign Application Priority Data

Dec. 21, 2022 (TW) ................................. 111149148

(51) Int. Cl.
*H05K 7/20* (2006.01)
*F25B 41/20* (2021.01)
*F25B 41/31* (2021.01)

(52) U.S. Cl.
CPC ............. *H05K 7/208* (2013.01); *F25B 41/20* (2021.01); *F25B 41/31* (2021.01);
(Continued)

(58) Field of Classification Search
CPC .............. F25B 41/22; F25B 2600/2519; F25B 2600/05; F25B 2500/03; F25B 43/006;
(Continued)

(56) References Cited

U.S. PATENT DOCUMENTS

| 4,522,037 A | 6/1985 | Ares et al. |
| 5,245,840 A | 9/1993 | Van Steenburgh, Jr. |

(Continued)

FOREIGN PATENT DOCUMENTS

| CN | 107270581 A | * | 10/2017 | ............ F25B 29/003 |
| CN | 109520170 A | * | 3/2019 | .............. F25B 13/00 |

(Continued)

OTHER PUBLICATIONS

"Office Action of Taiwan Counterpart Application", issued on Jun. 5, 2023, p. 1-p. 11.

(Continued)

*Primary Examiner* — Kun Kai Ma (57) ABSTRACT

A cooling system includes a compressor, a condenser, an evaporator, a first one-way valve, and a second one-way valve. The compressor includes a compressor inlet and a compressor outlet. The condenser includes a condenser inlet and a condenser outlet, and the compressor outlet communicates with the condenser inlet. The evaporator includes an evaporator inlet and an evaporator outlet, the condenser outlet communicates with the evaporator inlet, and the evaporator outlet communicates with the compressor inlet and the condenser inlet. The first one-way valve is disposed on a first flow path between the compressor outlet and the condenser inlet. The second one-way valve is disposed on a second flow path between the evaporator outlet and the condenser inlet.

13 Claims, 7 Drawing Sheets

(52) U.S. Cl.
CPC ... *F25B 2600/2513* (2013.01); *F25B 2700/04* (2013.01); *F25B 2700/21163* (2013.01)

(58) Field of Classification Search
CPC .... F25B 2400/0401; F25B 2700/21163; F25B 2700/04; F25B 2600/2513; F25B 41/31; F25B 41/20
See application file for complete search history.

(56) References Cited

U.S. PATENT DOCUMENTS

| | | |
|---|---|---|
| 2003/0037553 A1 | 2/2003 | Sulc et al. |
| 2011/0197614 A1 | 8/2011 | Lee |
| 2014/0033741 A1* | 2/2014 | Song .................. F24F 1/26 62/503 |
| 2015/0285539 A1 | 10/2015 | Kopko |
| 2021/0348811 A1 | 11/2021 | Shanmugam et al. |
| 2022/0275982 A1 | 9/2022 | Mieda et al. |
| 2022/0316780 A1 | 10/2022 | Kopko et al. |

FOREIGN PATENT DOCUMENTS

| | | | |
|---|---|---|---|
| CN | 111503913 A * | 8/2020 | |
| EP | 0672875 A2 * | 9/1995 | |
| JP | 2012183905 | 9/2012 | |
| KR | 20160130811 A * | 11/2016 | |
| WO | WO-2018116407 A1 * | 6/2018 | ................ F25B 1/00 |

OTHER PUBLICATIONS

"Partial Search Report of Europe Counterpart Application", issued on Oct. 5, 2023, p. 1-p. 13.

\* cited by examiner

COOLING SYSTEM

CROSS-REFERENCE TO RELATED APPLICATION

This application claims the priority benefit of Taiwan application serial no. 111149148, filed on Dec. 21, 2022. The entirety of the above-mentioned patent application is hereby incorporated by reference herein and made a part of this specification.

BACKGROUND

Technical Field

The disclosure relates to a cooling system; more particularly, the disclosure relates to a cooling system with good stability.

Description of Related Art

With the advancement of science and technology, power of electronic devices becomes higher and higher, and so does the requirement for heat dissipation. If a general refrigeration cycle system is applied for heat dissipation, the refrigeration cycle system is likely to encounter issues (e.g., condensations) due to the low temperature, and unstable load of the refrigeration cycle system may result in generating an excessive amount of liquid refrigerants, which may damage a compressor because the liquid refrigerants may enter the compressor.

SUMMARY

The disclosure provides a cooling system with improved stability.

According to an embodiment of the disclosure, a cooling system that includes a compressor, a condenser, an evaporator, a first one-way valve, and a second one-way valve is provided. The compressor includes a compressor inlet and a compressor outlet. The condenser includes a condenser inlet and a condenser outlet, and the compressor outlet communicates with the condenser inlet. The evaporator includes an evaporator inlet and an evaporator outlet, the condenser outlet communicates with the evaporator inlet, and the evaporator outlet communicates with the compressor inlet and the condenser inlet. The first one-way valve is disposed on a first flow path between the compressor outlet and the condenser inlet. The second one-way valve is disposed on a second flow path between the evaporator outlet and the condenser inlet.

In an embodiment of the disclosure, the cooling system further includes a refrigerant storage tank and a liquid level sensor disposed in the refrigerant storage tank, and the refrigerant storage tank is disposed between the evaporator outlet and the second flow path and between the evaporator outlet and the compressor inlet.

In an embodiment of the disclosure, the cooling system further includes a refrigerant storage tank and a liquid level sensor disposed in the refrigerant storage tank, and the refrigerant storage tank is disposed in the condenser.

In an embodiment of the disclosure, the cooling system further includes a refrigerant storage tank and a liquid level sensor disposed in the refrigerant storage tank, and the refrigerant storage tank is disposed between the condenser outlet and the evaporator.

In an embodiment of the disclosure, the cooling system further includes an expansion valve disposed between the condenser and the evaporator and includes an expansion valve inlet and an expansion valve outlet, the expansion valve inlet is connected to the condenser outlet, and the expansion valve outlet is connected to the evaporator inlet.

In an embodiment of the disclosure, the cooling system further includes a valve disposed between the condenser outlet and the evaporator inlet and connected in parallel to the expansion valve.

In an embodiment of the disclosure, the cooling system further includes an immersion cooling tank communicating with two transfer channels of the immersion cooling tank and communicating with a transfer power source of the two transfer channels, and the two transfer channels communicate with the evaporator.

According to an embodiment of the disclosure, an operating method of a cooling system is provided, and the operating method includes following steps. The above-mentioned cooling system is provided. A first circulation or a second circulation is selectively performed, where when the first circulation is selected to be performed, the compressor is powered on, a refrigerant sequentially passes through the compressor, the first flow path, and the condenser from the evaporator and returns to the evaporator, and when the second circulation is selected to be performed, the compressor is powered off, and the refrigerant sequentially passes through the second flow path and the condenser from the evaporator and returns to the evaporator.

In an embodiment of the disclosure, in the operating method, the cooling system further includes a refrigerant storage tank, and before the first circulation or the second circulation is selected to be performed, the operating method further includes following steps.

A liquid refrigerant level in the refrigerant storage tank is measured. Whether to power on or power off the compressor is adjusted according to the liquid refrigerant level, where when the liquid refrigerant level is less than a predetermined value, the first circulation is performed, and when the liquid refrigerant level is greater than or equal to the predetermined value, the second circulation is performed.

In an embodiment of the disclosure, the refrigerant storage tank is disposed between the evaporator outlet and the second flow path and between the evaporator outlet and the compressor inlet.

In an embodiment of the disclosure, the refrigerant storage tank is disposed in the condenser.

In an embodiment of the disclosure, the refrigerant storage tank is disposed between the condenser and the evaporator.

In an embodiment of the disclosure, in the operating method, the cooling system further includes an expansion valve and a valve, the expansion valve is disposed between the condenser and the evaporator, the expansion valve includes an expansion valve inlet and an expansion valve outlet, the expansion valve inlet is connected to the condenser outlet, the expansion valve outlet is connected to the evaporator inlet, the valve is disposed between the condenser outlet and the evaporator inlet and connected in parallel to the expansion valve, and the operating method further includes following steps. A refrigerant temperature at the condenser outlet is measured. A switch of the valve is adjusted according to the refrigerant temperature, where when the refrigerant temperature is lower than a predetermined temperature, the valve is powered on, so that the refrigerant leaving the condenser flows to the evaporator via the valve, and when the refrigerant temperature is higher than or equal to the predetermined temperature, the valve is powered off, so that the refrigerant leaving the condenser flows to the evaporator via the expansion valve.

In light of the foregoing, the first one-way valve of the cooling system provided in one or more embodiments of the disclosure is disposed on the first flow path between the compressor outlet and the condenser inlet, and the second one-way valve is disposed on the second flow path between the evaporator outlet and the condenser inlet. The cooling system may select to perform the first circulation or the second circulation. When the first circulation is selected to be performed, the compressor is powered on, the second one-way valve is powered off, and the refrigerant sequentially passes through the compressor, the first flow path, and the condenser from the evaporator and returns to the evaporator. When the second circulation is selected to be performed, the compressor is powered off, the first one-way valve is powered off, and the refrigerant sequentially passes through the second flow path and the condenser from the evaporator and returns to the evaporator. When the amount of liquid refrigerant becomes excessive, the second circulation is performed to prevent the liquid refrigerant from entering the compressor and causing damages to the compressor, so that the cooling system may have an improved stability.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
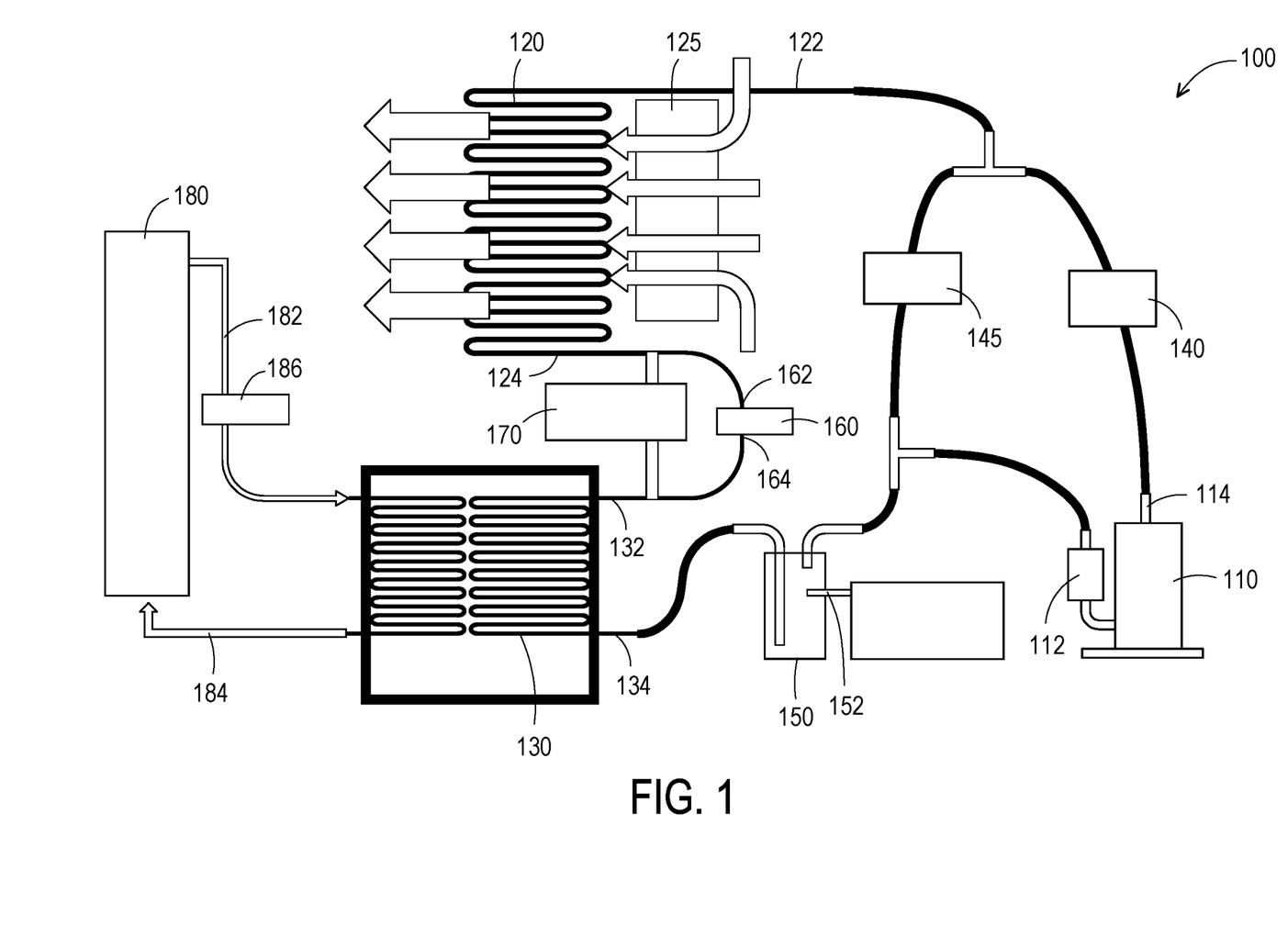
FIG. 1 is a schematic view illustrating a cooling system according to an embodiment of the disclosure.
Figure 2:
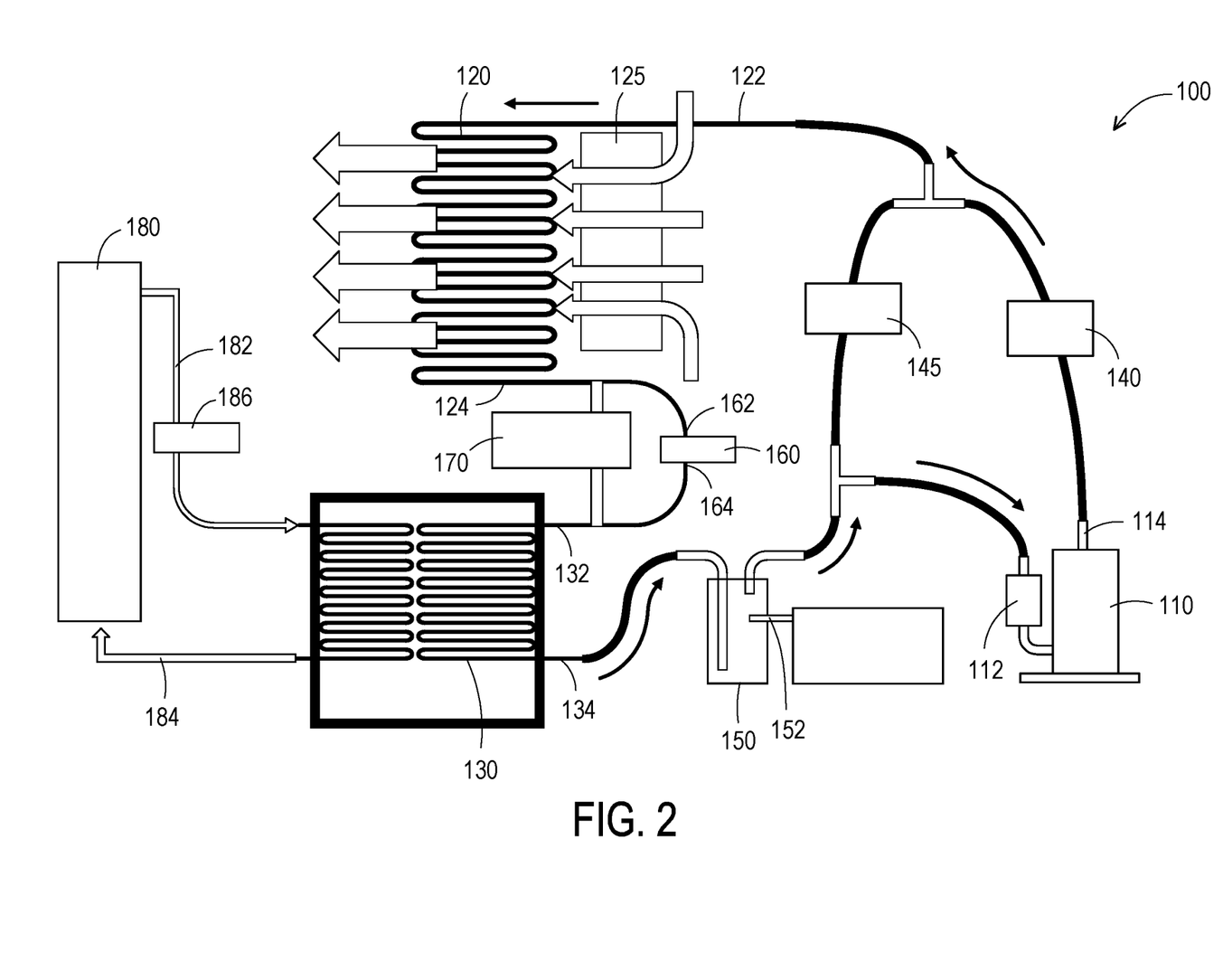
FIG. 2 is a schematic view illustrating the cooling system depicted in FIG. 1 performs a first circulation.
Figure 3:
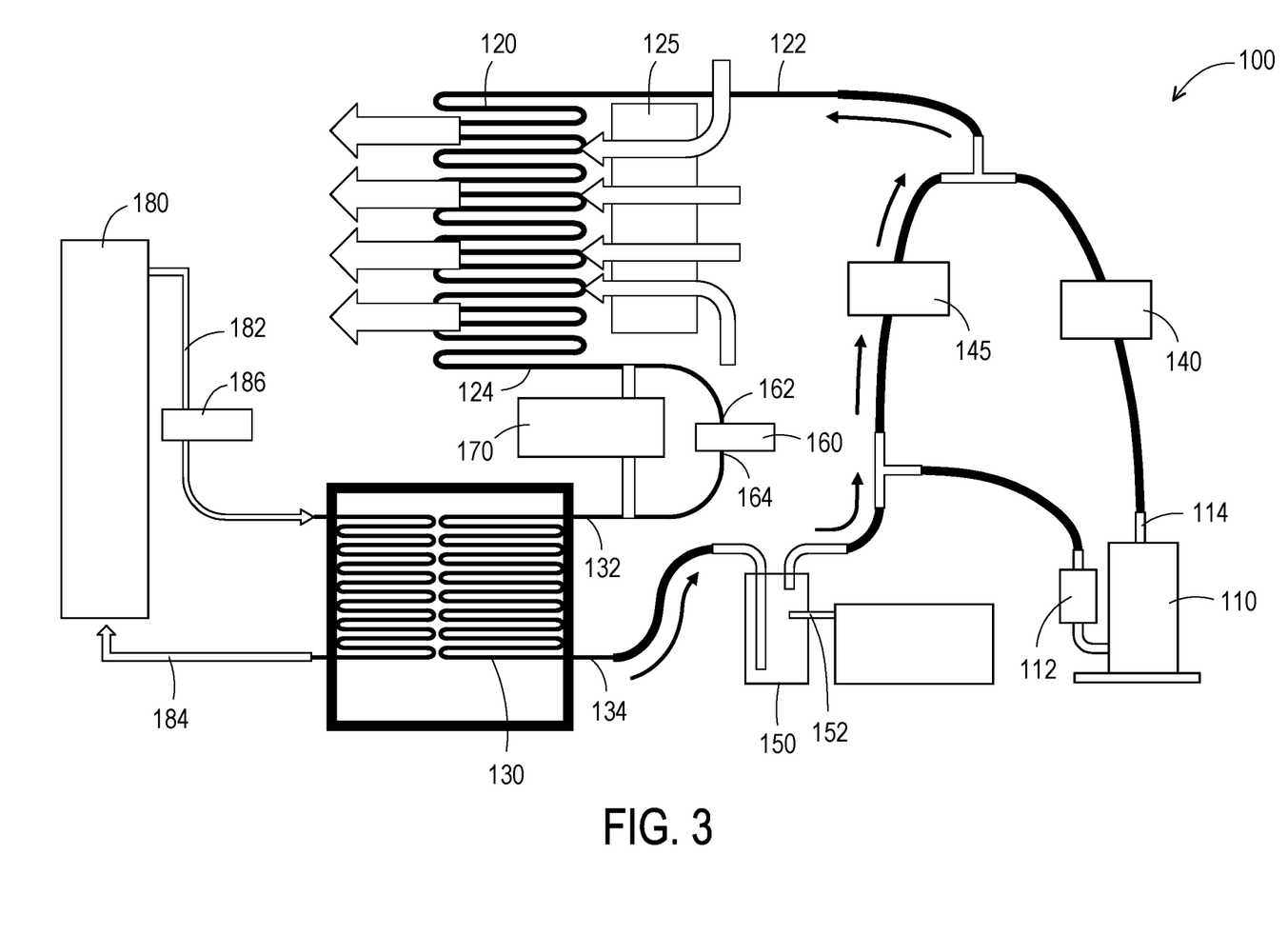
FIG. 3 is a schematic view illustrating the cooling system depicted in FIG. 1 performs a second circulation.

FIG. 1 is a schematic view illustrating a cooling system according to an embodiment of the disclosure. FIG. 2 is a schematic view illustrating the cooling system depicted in FIG. 1 performs a first circulation. With reference to FIG. 1 and FIG. 2, a cooling system 100 provided in this embodiment may be configured for heat dissipation of servers and other electronic devices, while the application of the cooling system 100 is not limited to what is disclosed herein. The cooling system 100 provided in this embodiment may perform the first circulation (FIG. 2) or a second circulation (FIG. 3). Elements of the cooling system 100 and the first circulation performed by the cooling system 100 will be described below.

The cooling system 100 provided in this embodiment includes a compressor 110, a condenser 120, an evaporator 130, a first one-way valve 140, and a second one-way valve 145. The compressor 110 includes a compressor inlet 112 and a compressor outlet 114. The condenser 120 includes a condenser inlet 122 and a condenser outlet 124, and the compressor outlet 114 communicates with the condenser inlet 122. The first one-way valve 140 is disposed on a first flow path between the compressor outlet 114 and the condenser inlet 122. The second one-way valve 145 is disposed on a second flow path between the evaporator outlet 134 and the condenser inlet 122. As shown in FIG. 2, in the first circulation, the first one-way valve 140 is powered on, and second one-way valve 145 is powered off.

The compressor 110 is configured to convert a low-pressure gaseous refrigerant into a high-pressure superheated vapor which then flows to the condenser 120. A fan 125 is disposed next to the condenser 120 for dissipating heat of the condenser 120. The condenser 120 transfers heat energy of the high-pressure superheated vapor refrigerant to the surrounding medium (water or air), so that the heat energy is taken away. The refrigerant in form of the high-pressure superheated vapor is re-condensed into a normal-temperature and high-pressure liquid refrigerant in the condenser 120.

Besides, the evaporator 130 includes an evaporator inlet 132 and an evaporator outlet 134. The condenser outlet 124 communicates with the evaporator inlet 132. Specifically, the cooling system 100 provided in this embodiment further includes an expansion valve 160 disposed between the condenser 120 and the evaporator 130. The expansion valve 160 includes an expansion valve inlet 162 and an expansion valve outlet 164, the expansion valve inlet 162 is connected to the condenser outlet 124, and the expansion valve outlet 164 is connected to the evaporator inlet 132. In addition, the evaporator outlet 134 communicates with the compressor inlet 112 and the condenser inlet 122.

The normal-temperature and high-pressure liquid refrigerant, when flowing through the expansion valve 160, is throttled and depressurized and is then converted into a low-temperature and low-pressure wet vapor refrigerant (a major portion of which is a liquid refrigerant and a minor portion of which is a vapor refrigerant), and then the low-temperature and low-pressure wet vapor refrigerant enters the evaporator 130 and is vaporized and absorbs heat in the evaporator 130, thereby achieving a cooling effect. That is, when the first circulation is selected to be performed, the compressor 110 is powered on, the first one-way valve 140 is powered on, the second one-way valve 145 is powered off, and the refrigerant sequentially passes through the compressor 110, the first flow path, and the condenser 120 from the evaporator 130 and returns to the evaporator 130.

In addition, the cooling system 100 further includes an immersion cooling tank 180, two transfer channels 182 and 184 that communicate with the immersion cooling tank 180, and a transfer power source 186 (e.g., a pump) that communicates with the two transfer channels 182 and 184. The two transfer channels 182 and 184 communicate with the evaporator 130. Servers and other electronic devices that require heat dissipation may be immersed in the immersion cooling tank 180, so that the liquid (e.g., cooling oil) in the immersion cooling tank 180 may cool down the servers. The cooling oil is sucked by the transfer power source 186 and enters the evaporator 130 from the transfer channel 182 to perform the heat exchange with the refrigerant, so that the hot cooling oil becomes cold cooling oil, and the cold cooling oil then returns to the immersion cooling tank 180 from the transfer channel 184.

In addition, the cooling system 100 further includes a refrigerant storage tank 150 and a liquid level sensor 152 disposed in the refrigerant storage tank 150, and the refrigerant storage tank 150 is disposed between the evaporator outlet 134 and the second flow path (the second one-way valve 145) and between the evaporator outlet 134 and the compressor inlet 112. The liquid level sensor 152 may serve to sense a liquid refrigerant level in the refrigerant storage tank 150 to select whether the cooling system 100 is to perform the first circulation or the second circulation.

Namely, the cooling system 100 controls whether to power on or power off the compressor 110, the first one-way valve 140 and the second one-way valve 145 according to the liquid refrigerant level. Specifically, when the liquid refrigerant level is less than a predetermined value, it indicates that the amount of the liquid refrigerant circulated in the cooling system 100 is adequate, and the compressor 110 does not suck the liquid refrigerant. At this time, the compressor 110 is powered on, the first one-way valve 140 is powered on, and the second one-way valve 145 is powered off, so as to perform the first circulation.

When the liquid refrigerant level is greater than or equal to the predetermined value, it indicates that the amount of the liquid refrigerant circulated in the cooling system 100 is excessive, and the compressor 110 may suck and compress the liquid refrigerant, which may lead to damages.

In order to prevent said issue, the cooling system 100 provided in this embodiment may also select to perform the second circulation. FIG. 3 is a schematic view illustrating the cooling system depicted in FIG. 1 performs a second circulation. With reference to FIG. 3, in the second circulation, the compressor 110 stops operating, the first one-way valve 140 is powered off, and the second one-way valve 145 is powered on.

In FIG. 3, when the compressor 110 is not in operation, the cooling system 100 may achieve the purpose of circulation by a pressure difference generated due to the temperature difference between the evaporator 130 and the condenser 120 themselves. The refrigerant sequentially passes through the second flow path and the condenser 120 from the evaporator 130 and returns to the evaporator 130.

Specifically, since the pressure at the evaporator outlet 134 (the pressure of the high-pressure gaseous refrigerant) is greater than the pressure at the condenser inlet 122, when the compressor 110 is not in operation, the refrigerant flows directly to the condenser inlet 122 through the second one-way valve 145, and the first one-way valve 140 may prevent the refrigerant from flowing back to the compressor 110. On such a condition, since the compressor 110 is not in operation, the liquid refrigerant in the refrigerant storage tank 150 does not flow to the compressor 110 and thus does not cause damages the compressor 110.

That is, when the liquid level sensor 152 senses that the liquid refrigerant level in the refrigerant storage tank 150 is excessively high (indicating the excessive amount of the liquid refrigerant), a controller (not shown) stops the operation of the compressor 110. At this time, the evaporator 130 still continues to absorb the heat, and thus the refrigerant continues to be evaporated and flow to the condenser 120 through the second one-way valve 145, so that the cooling system 100 is still capable of dissipating the heat. It is not necessary to power on the compressor 110 again to actively transfer the refrigerant until the heat dissipation capability becomes insufficient.

Figure 4:
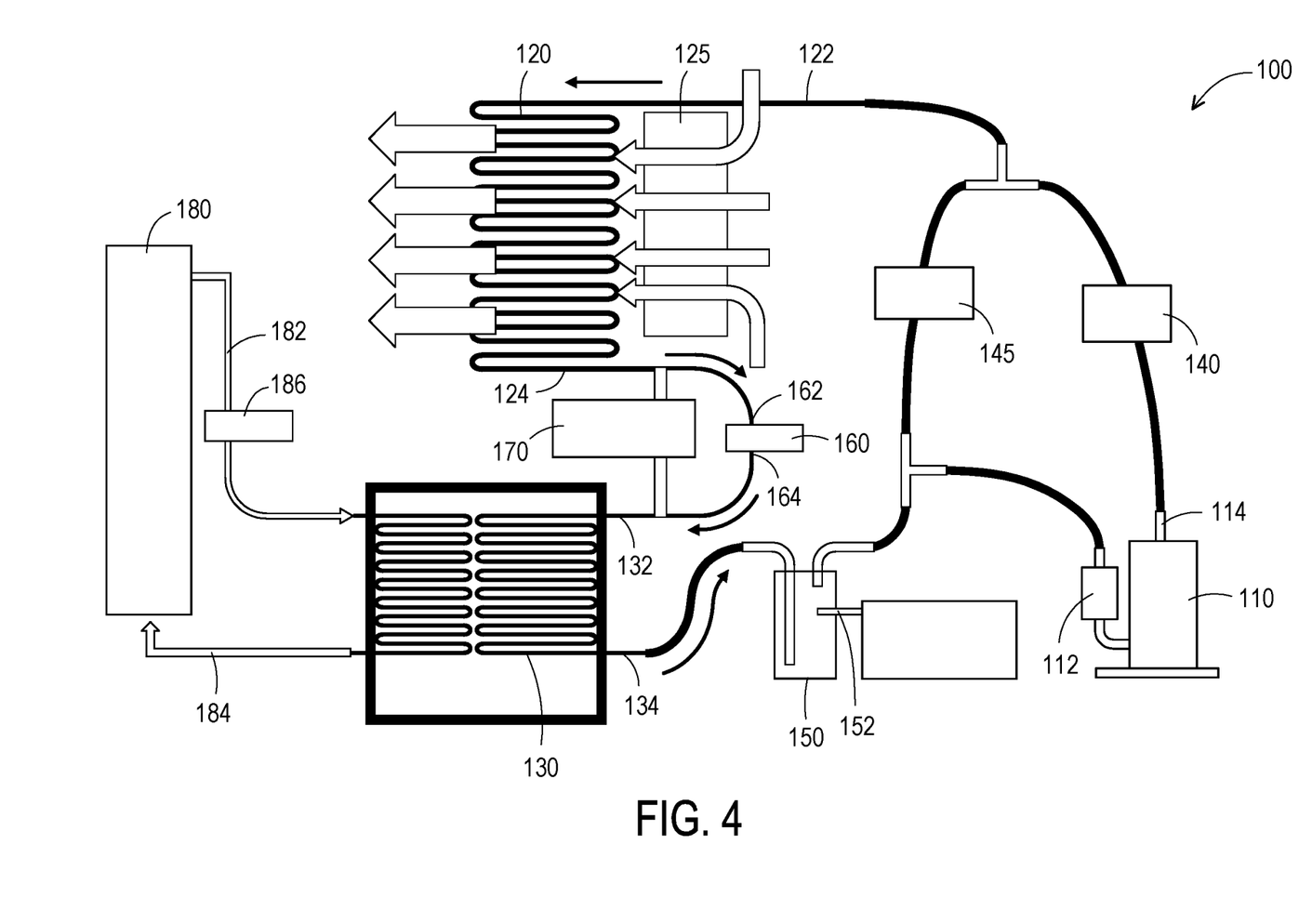
FIG. 4 is a schematic view illustrating a refrigerant flowing through an expansion valve in the cooling system depicted in FIG. 1.

FIG. 4 is a schematic view illustrating a refrigerant flowing through an expansion valve in the cooling system depicted in FIG. 1. With reference to FIG. 4, the cooling system 100 provided in this embodiment further includes a valve 170 that is disposed between the condenser outlet 124 and the evaporator inlet 132 and connected in parallel to the expansion valve 160. The valve 170 is, for instance, a solenoid valve, but not limited thereto.

The cooling system 100 may adjust the switch of the valve 170 according to a refrigerant temperature at the condenser outlet 124. When the refrigerant temperature at the condenser outlet 124 is higher than or equal to a predetermined temperature, it indicates that the refrigerant temperature is overly high, and the valve 170 is power offed, so that the refrigerant leaving the condenser 120 flows to the evaporator 130 through the expansion valve 160. Therefore, the refrigerant may be depressurized and cooled down by the expansion valve 160, and the resultant refrigerant of a sufficiently low temperature is generated and enters the evaporator 130.

Figure 5:
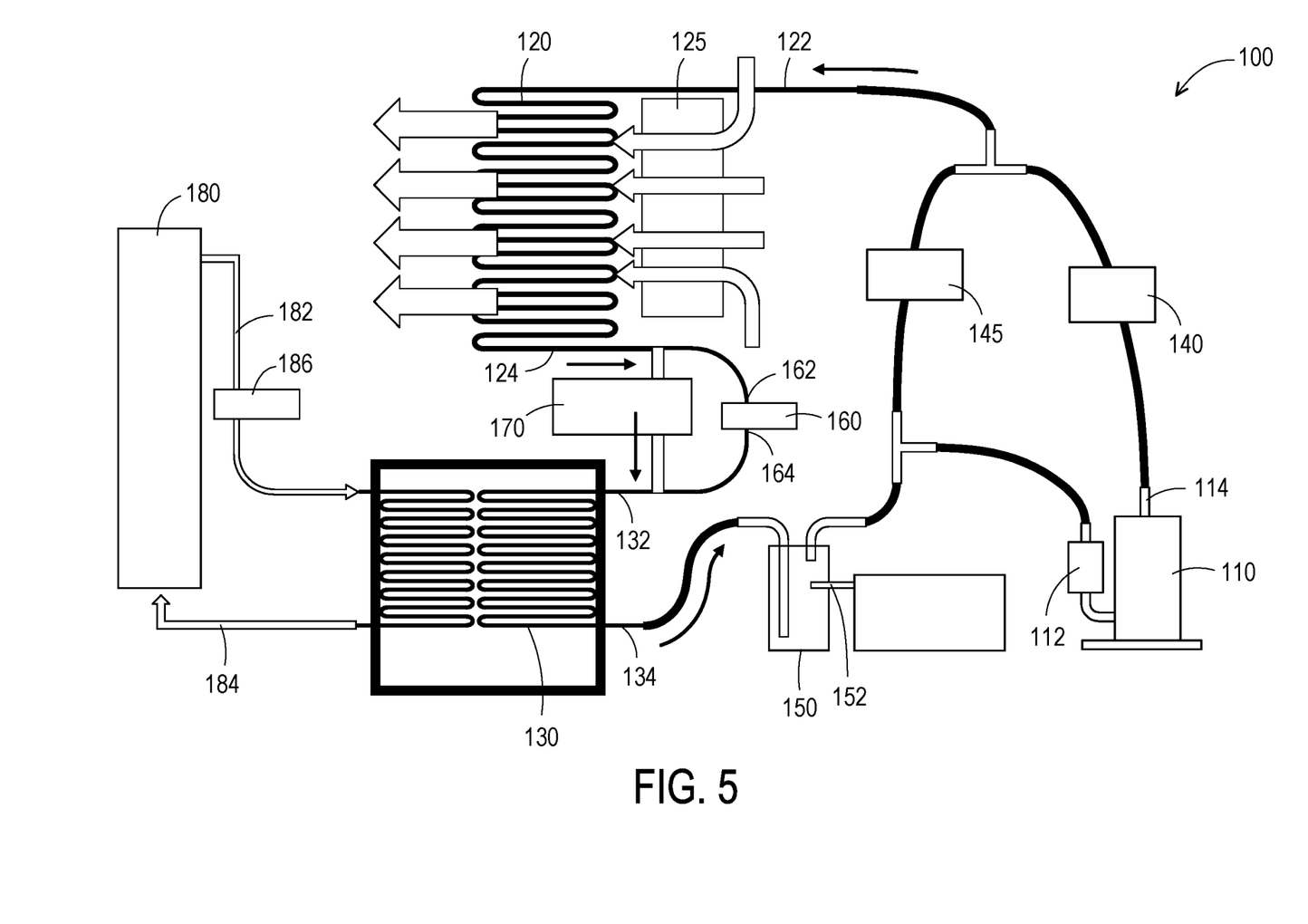
FIG. 5 is a schematic view illustrating a refrigerant flowing through a valve in the cooling system depicted in FIG. 1.

FIG. 5 is a schematic view illustrating a refrigerant flowing through a valve in the cooling system depicted in FIG. 1. With reference to FIG. 5, when the refrigerant temperature is lower than the predetermined temperature, it indicates that the refrigerant temperature is sufficiently low and need not be depressurized and cooled down by the expansion valve 160, and the valve 170 is powered on, so that the refrigerant leaving the condenser 120 flows to the evaporator 130 through the valve 170. The process of the refrigerant flowing through the valve 170 is a transfer process without lowering the temperature, which may prevent the decrease in the pressure and the resultant low-temperature condensation.

Figure 6:
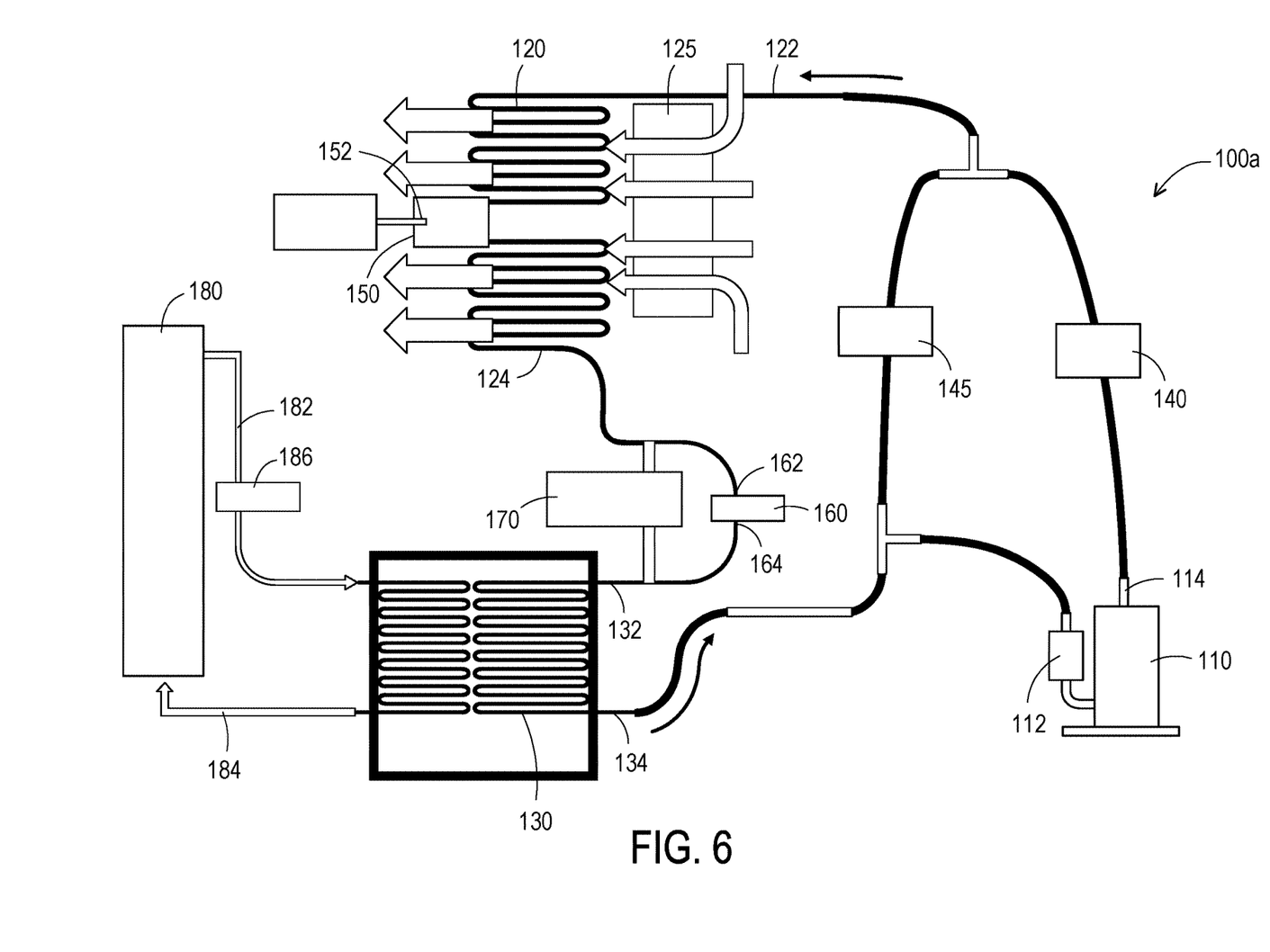
FIG. 6 is a schematic view illustrating a cooling system according to another embodiment of the disclosure.
Figure 7:
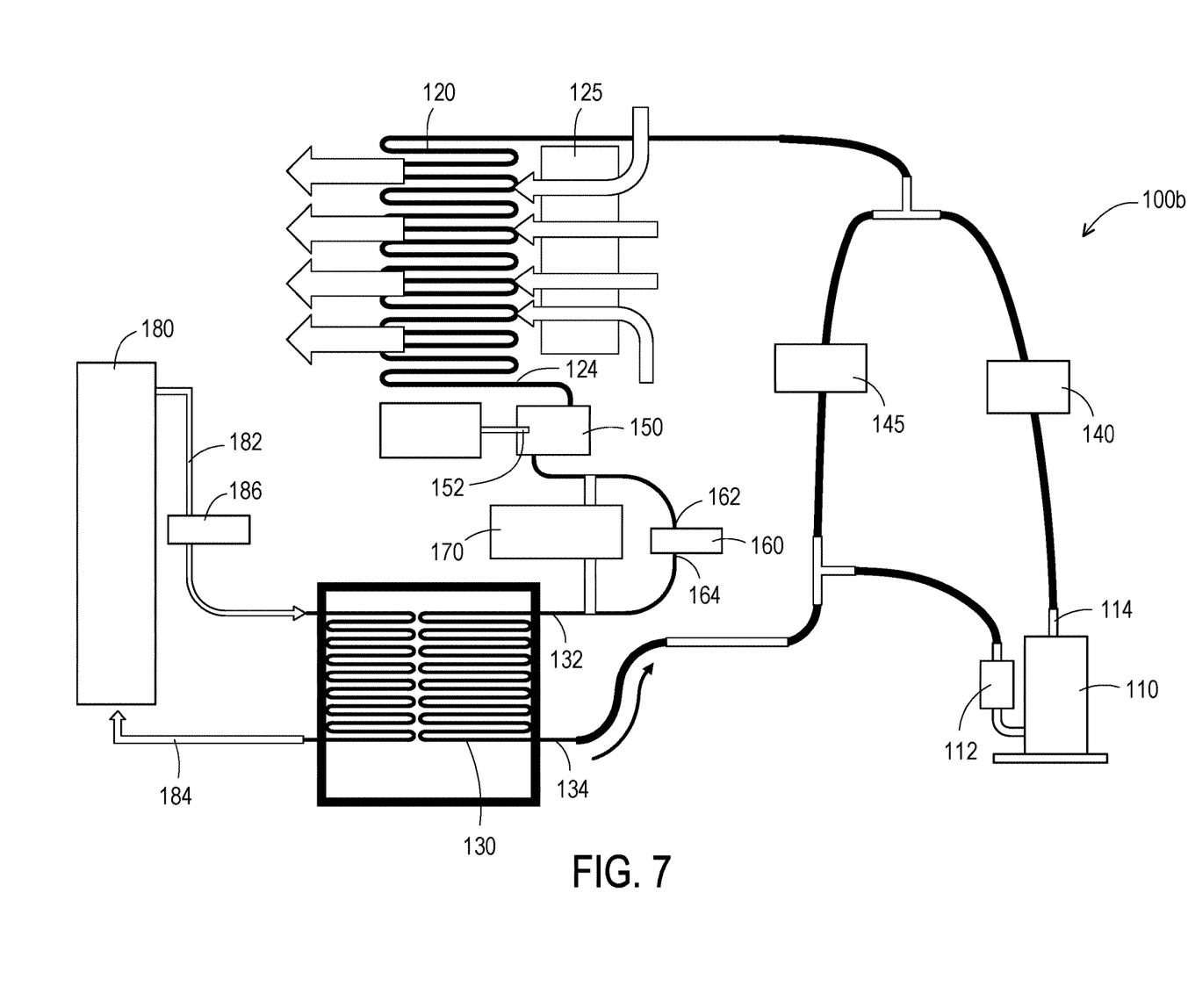
FIG. 7 is a schematic view illustrating a cooling system according to another embodiment of the disclosure.

FIG. 6 is a schematic view illustrating a cooling system according to another embodiment of the disclosure. With reference to FIG. 6, one of the differences between a cooling system 100a depicted in FIG. 6 and the cooling system 100 depicted in FIG. 1 lies in that the refrigerant storage tank 150 is disposed in the condenser 120 according to this embodiment. FIG. 7 is a schematic view illustrating a cooling system according to another embodiment of the disclosure. With reference to FIG. 7, one of the differences between a cooling system 100b depicted in FIG. 7 and the cooling system 100 depicted in FIG. 1 lies in that the refrigerant storage tank 150 is disposed between the condenser outlet 124 and the evaporator 130 according to this embodiment.

Similarly, in FIG. 6 and FIG. 7, when the liquid level sensor 152 senses that the liquid refrigerant level in the refrigerant storage tank 150 is overly low (representing an insufficient amount of the refrigerant), the compressor 110 is powered on, and the second one-way valve 145 is powered off. When the liquid level sensor 152 senses that the liquid refrigerant level in the refrigerant storage tank 150 is overly high (representing an excessive amount of the refrigerant), the controller (not shown) stops the operation of the compressor 110, and the first one-way valve 140 is powered off, so that the cooling system 100 may have a favorable stability.

To sum up, in one or more embodiments of the disclosure, the first one-way valve of the cooling system is disposed on the first flow path between the compressor outlet and the condenser inlet, and the second one-way valve is disposed on the second flow path between the evaporator outlet and the condenser inlet. The cooling system may select to perform the first circulation or the second circulation. When the first circulation is selected to be performed, the compressor is powered on, the second one-way valve is powered off, and the refrigerant sequentially passes through the compressor, the first flow path, and the condenser from the evaporator and returns to the evaporator. When the second circulation is selected to be performed, the compressor is powered off, the first one-way valve is powered off, and the refrigerant sequentially passes through the second flow path and the condenser from the evaporator and returns to the evaporator. When the amount of the liquid refrigerant is excessive, the second circulation is performed to prevent the liquid refrigerant from entering the compressor and causing damages to the compressor, so that the cooling system may have an improved stability.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A cooling system, comprising:
   a compressor, comprising a compressor inlet and a compressor outlet;
   a condenser, comprising a condenser inlet and a condenser outlet, the compressor outlet communicating with the condenser inlet;
   an evaporator, comprising an evaporator inlet and an evaporator outlet, the condenser outlet communicating with the evaporator inlet, the evaporator outlet communicating with the compressor inlet and the condenser inlet;
   a first one-way valve, disposed on a first flow path between the compressor outlet and the condenser inlet; and
   a second one-way valve, disposed on a second flow path between the evaporator outlet and the condenser inlet,
   wherein a refrigerant sequentially passes through the second flow path and the condenser from the evaporator and returns to the evaporator in response to the compressor is powered off.

2. The cooling system according to claim 1, further comprising: a refrigerant storage tank and a liquid level sensor disposed in the refrigerant storage tank, the refrigerant storage tank being disposed between the evaporator outlet and the second flow path and between the evaporator outlet and the compressor inlet.

3. The cooling system according to claim 1, further comprising: a refrigerant storage tank and a liquid level sensor disposed in the refrigerant storage tank, the refrigerant storage tank being disposed in the condenser.

4. The cooling system according to claim 1, further comprising: a refrigerant storage tank and a liquid level sensor disposed in the refrigerant storage tank, the refrigerant storage tank being disposed between the condenser outlet and the evaporator.

5. The cooling system according to claim 1, further comprising: an expansion valve disposed between the condenser and the evaporator and comprising an expansion valve inlet and an expansion valve outlet, wherein the expansion valve inlet is connected to the condenser outlet, and the expansion valve outlet is connected to the evaporator inlet.

6. The cooling system according to claim 5, further comprising: a valve disposed between the condenser outlet and the evaporator inlet and connected in parallel to the expansion valve.

7. The cooling system according to claim 1, further comprising: an immersion cooling tank communicating with two transfer channels of the immersion cooling tank and communicating with a transfer power source of the two transfer channels, the two transfer channels communicating with the evaporator.

8. An operating method of a cooling system, comprising:
   providing the cooling system according to claim 1; and
   selectively performing a first circulation or a second circulation, wherein in responsive to the first circulation is selected to be performed, the compressor is powered on, the refrigerant sequentially passes through the compressor, the first flow path, and the condenser from the evaporator and returns to the evaporator, and in responsive to the second circulation is selected to be performed, the compressor is powered off.

9. The operating method according to claim 8, wherein the cooling system further comprises a refrigerant storage tank, and before the first circulation or the second circulation is selected to be performed, the operating method further comprises:
   measuring a liquid refrigerant level in the refrigerant storage tank; and
   adjusting whether to power on or power off the compressor according to the liquid refrigerant level, wherein when the liquid refrigerant level is less than a predetermined value, the first circulation is performed, and when the liquid refrigerant level is greater than or equal to the predetermined value, the second circulation is performed.

10. The operating method according to claim 9, wherein the refrigerant storage tank is disposed between the evaporator outlet and the second flow path and between the evaporator outlet and the compressor inlet.

11. The operating method according to claim 9, wherein the refrigerant storage tank is disposed in the condenser.

12. The operating method according to claim 9, wherein the refrigerant storage tank is disposed between the condenser and the evaporator.

13. The operating method according to claim 8, wherein the cooling system further comprises an expansion valve and a valve, the expansion valve is disposed between the condenser and the evaporator, the expansion valve comprises an expansion valve inlet and an expansion valve outlet, the expansion valve inlet is connected to the condenser outlet, the expansion valve outlet is connected to the evaporator inlet, the valve is disposed between the condenser outlet and the evaporator inlet and connected in parallel to the expansion valve, and the operating method further comprises:
   measuring a refrigerant temperature at the condenser outlet; and
   adjusting a switch of the valve according to the refrigerant temperature, wherein in responsive to the refrigerant temperature is lower than a predetermined temperature, the valve is powered on, so that the refrigerant leaving the condenser flows to the evaporator via the valve, and in responsive to the refrigerant temperature is higher than or equal to the predetermined temperature, the valve is powered off, so that the refrigerant leaving the condenser flows to the evaporator via the expansion valve.

* * * * *